(12) United States Patent  
Iwane et al.

(10) Patent No.: US 8,078,416 B2  
(45) Date of Patent: Dec. 13, 2011

(54) REMAINING ELECTRICAL CHARGE/REMAINING CAPACITY ESTIMATING METHOD, BATTERY STATE SENSOR AND BATTERY POWER SOURCE SYSTEM

(75) Inventors: Noriyasu Iwane, Tokyo (JP); Yuichi Watanabe, Tokyo (JP); Toshiyuki Sato, Tokyo (JP); Atsushi Kimura, Tokyo (JP); Fumikazu Iwahana, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 236 days.

(21) Appl. No.: 11/987,615

(22) Filed: Dec. 3, 2007

(65) Prior Publication Data

US 2009/0030626 A1    Jan. 29, 2009

Related U.S. Application Data

(63) Continuation of application No. PCT/JP2006/311115, filed on Jun. 2, 2006.

(30) Foreign Application Priority Data

Jun. 3, 2005  (JP) ................................ 2005-164112

(51) Int. Cl.  
*G01R 31/36* (2006.01)

(52) U.S. Cl. ................ 702/63; 702/57; 702/64; 702/65; 702/127

(58) Field of Classification Search .................... 702/60, 702/63–64  
See application file for complete search history.

(56) References Cited

U.S. PATENT DOCUMENTS

| | | | |
|---|---|---|---|
| 6,531,875 B2 | 3/2003 | Satake | |
| 6,794,876 B2 | 9/2004 | Kawaguchi et al. | |
| 2006/0208704 A1 | 9/2006 | Iwane et al. | |

FOREIGN PATENT DOCUMENTS

| | | |
|---|---|---|
| EP | 1643260 | 4/2006 |
| JP | 8-179018 | 7/1996 |
| JP | 7-98367 | 4/1998 |
| JP | 2002-234408 | 8/2002 |
| JP | 2003-75518 | 3/2003 |
| JP | 2003-307556 | 10/2003 |
| JP | 2005-43339 | 2/2005 |
| WO | 2005-006006 | 1/2005 |

OTHER PUBLICATIONS

U.S. Appl. No. 12/014,502, filed Jan. 15, 2008, Iwahana et al.  
U.S. Appl. No. 12/041,972, filed Mar. 4, 2008, Iwane.  
U.S. Appl. No. 12/049,907, filed Mar. 17, 2008, Iwane et al.

*Primary Examiner* — Drew A Dunn  
*Assistant Examiner* — Mischita Henson  
(74) *Attorney, Agent, or Firm* — Oblon, Spivak, McClelland, Maier & Neustadt, L.L.P.

(57) ABSTRACT

A method for estimating a remaining electrical charge or a remaining capacity of a battery that supplies power to a load, the method including: using, at a controller of a battery system, an approximate exponential decay function including a plurality of exponential function terms of time and a plurality of coefficients; stopping, at the battery system, a charge or discharge operation of the battery for a predetermined time; measuring, at a sensor of the battery system, a voltage of the battery at a plurality of instances during the predetermined time; obtaining, at the controller of the battery system, a relationship between the voltage of the battery and time; determining, at the controller of the battery system, the coefficients based on the obtained relationship between the voltage of the battery and the time.

15 Claims, 8 Drawing Sheets

REMAINING ELECTRICAL CHARGE/REMAINING CAPACITY ESTIMATING METHOD, BATTERY STATE SENSOR AND BATTERY POWER SOURCE SYSTEM

CROSS REFERENCE TO RELATED APPLICATIONS

This application is a continuation of PCT/JP2006/311115 filed on Jun. 2, 2006. The contents of each of these documents are incorporated herein by reference.

TECHNICAL FIELD

The present invention relates to a method for estimating a remaining electrical charge/remaining capacity of a battery for supplying power to a load, a sensor for detecting a state of the battery and a battery power source system having such a sensor.

BACKGROUND ART

Conventionally, there are demands for accurately obtaining a remaining electrical charge of a secondary battery for backup or power source of various devices or a secondary battery such as a lead battery mounted on a vehicle. Generally, in the secondary battery, as there is a correlation between a remaining electrical charge and an open circuit voltage, the remaining electrical charge can be estimated by obtaining the open circuit voltage. However, the open circuit voltage of the secondary battery has to be obtained while charge or discharge is not performed, and it takes long time until the open circuit voltage becomes stable after charge or discharge is finished. Therefore, there has been proposed a way of measuring the open circuit voltage under predetermined conditions for a short time and using a function for approximately obtaining the open circuit voltage with time characteristic to obtain a convergence value of the open circuit voltage (see, for example, patent documents 1 to 3).

In order to obtain the convergence value of the open circuit voltage of the secondary battery by the above-mentioned way, its accuracy depends on the accuracy of the function used in approximate calculation. For example, a function of time characteristic, such as a polynomial function or a logarithmic function, is usually used as a basis to obtain the convergence value of the open circuit voltage. However, it is difficult to approximate the open circuit voltage of the secondary battery with time characteristic with high accuracy, and the obtained convergence value of the open circuit voltage might show a large error. Hence, when the above-mentioned way is used in estimating of the remaining electrical charge of the secondary battery, high accuracy is hard to be assured under the constraints of function used in approximate calculation and the remaining electrical charge cannot be estimated accurately, which presents a problem.

Meanwhile, the above-listed patent document 4 discloses a way of measuring a plurality of voltages along the time axis within a predetermined time period after completion of charge or discharge of a secondary battery, using the voltages in successive calculation to obtain a convergence value of the open circuit voltage of the secondary battery and using a $4^{th}$ order or more exponential decay function so as to approximate a time characteristic of the open circuit voltage of the secondary battery.

[Patent document 1] Japanese Patent Laid-open Publication No. 7-98367

[Patent document 2] Japanese Patent Laid-open Publication No. 2002-234408

[Patent document 3] Japanese Patent Laid-open Publication No. 2003-75518

[Patent document 4] Internal Publication No. WO2005/006006

DISCLOSURE OF THE INVENTION

Problems to be Solved by the Invention

According to the remaining electrical charge estimating method disclosed in the patent document 4, the accuracy of approximating the time characteristic of the open circuit voltage can be improved as compared with the case of using a polynomial function or a logarithmic function, however, in order to assure high accuracy in obtaining a convergence value, it is necessary to stop charge and discharge for a relatively long time and measure change in the battery voltage in the meantime, which constitutes a large restriction on the system operation. Besides, there are many coefficients required to be calculated out in operation and calculation load is heavy, which presents a problem of requirement for a high-performance CPU.

The present invention was carried out to solve such a problem, and has an object to provide a remaining electrical charge estimating method for obtaining a convergence value of the open circuit voltage of the secondary battery with high accuracy, in a shorter time and with less calculation load, as compared with the conventionally way.

Means for Solving the Problems

In order to solve the above-mentioned problems, the present invention provides the followings.

A first aspect of the present invention is a remaining electrical charge/remaining capacity estimating method for estimating a remaining electrical charge or a remaining capacity of a battery for supplying power to a load, the method comprising: a voltage estimating step of obtaining a stable open circuit voltage estimated value after a lapse of desired time, the step including: a step of using an approximate function including a plurality of exponential function terms of time and a plurality of coefficients, stopping charge or discharge operation for a predetermined time, measuring a battery voltage over time during the time and using an obtained relation between the battery voltage and the time as a basis to determine the coefficients; and a step of determining at least one power coefficient of inferior logarithm of the exponential function terms based on temperature by expressing the coefficient as a previously obtained function of temperature.

Further, a second aspect of the present invention is a remaining electrical charge/remaining capacity estimating method of the above-mentioned first aspect, in which a time is allowed between stopping of the charge operation and starting of measuring of the battery voltage to reduce the exponential function terms in number.

A third aspect of the present invention is a remaining electrical charge/remaining capacity estimating method for estimating a remaining electrical charge or a remaining capacity of a battery for supplying power to a load, the method comprising: a voltage estimating step of obtaining a stable open circuit voltage estimated value after a lapse of desired time, the step including: a step of using an approximate function including a plurality of exponential function terms of time and a plurality of coefficients, stopping charge or discharge operation for a predetermined time, measuring a battery voltage over time during the time and using an obtained relation between the battery voltage and the time as a basis to determine the coefficients; and a step of determining at least one power coefficient of inferior logarithm of the exponential function terms by expressing the coefficient as a predetermined function of another specified power coefficient.

Further, a fourth aspect of the present invention is a remaining electrical charge/remaining capacity estimating method of the above-mentioned third aspect, in which a time is allowed between stopping of the charge operation and starting of measuring of the battery voltage to reduce the exponential function terms in number.

A fifth aspect of the present invention is a battery state sensor having a circuit for estimating a remaining electrical charge or a remaining capacity of a battery for supplying power to a load, the battery state sensor comprising: a voltage estimating unit for obtaining a stable open circuit voltage estimated value after a lapse of desired time, the voltage estimating unit using an approximate function including a plurality of exponential function terms of time and a plurality of coefficients, stopping charge or discharge operation for a predetermined time, measuring a battery voltage over time during the time and using an obtained relation between the battery voltage and the time as a basis to determine the coefficients; and determining at least one power coefficient of inferior logarithm of the exponential function terms based on temperature by expressing the coefficient as a previously obtained function of temperature.

Further, a sixth aspect of the present invention is a battery state sensor of the above-mentioned fifth aspect, in which the voltage estimating unit operates to allow a time between stopping of the charge operation and starting of measuring of the battery voltage to reduce the exponential function terms in number.

A seventh aspect of the present invention is a battery state sensor having a circuit for estimating a remaining electrical charge or a remaining capacity of a battery for supplying power to a load, the battery state sensor comprising: a voltage estimating unit for obtaining a stable open circuit voltage estimated value after a lapse of desired time, the voltage estimating unit using an approximate function including a plurality of exponential function terms of time and a plurality of coefficients, stopping charge or discharge operation for a predetermined time, measuring a battery voltage over time during the time and using an obtained relation between the battery voltage and the time as a basis to determine the coefficients; and determining at least one power coefficient of inferior logarithm of the exponential function terms by expressing the coefficient as a predetermined function of another specified power coefficient.

Further, an eighth aspect of the present invention is a battery state sensor of the above-mentioned seventh aspect, in which the voltage estimating unit operates to allow a time between stopping of the charge operation and starting of measuring of the battery voltage to reduce the exponential function terms in number.

A ninth aspect of the present invention is a battery power source system having a circuit for estimating a remaining electrical charge or a remaining capacity of a battery for supplying power to a load, the battery state sensor comprising: a voltage estimating unit for obtaining a stable open circuit voltage estimated value after a lapse of desired time, the voltage estimating unit using an approximate function including a plurality of exponential function terms of time and a plurality of coefficients, stopping charge or discharge operation for a predetermined time, measuring a battery voltage over time during the time and using an obtained relation between the battery voltage and the time as a basis to determine the coefficients; and determining at least one power coefficient of inferior logarithm of the exponential function terms based on temperature by expressing the coefficient as a previously obtained function of temperature.

Further, a tenth aspect of the present invention is a battery power source system of the above-mentioned ninth aspect, in which the voltage estimating unit operates to allow a time between stopping of the charge operation and starting of measuring of the battery voltage to reduce the exponential function terms in number.

An eleventh aspect of the present invention is a battery power source system having a circuit for estimating a remaining electrical charge or a remaining capacity of a battery for supplying power to a load, the battery state sensor comprising: a voltage estimating unit for obtaining a stable open circuit voltage estimated value after a lapse of desired time, the voltage estimating unit using an approximate function including a plurality of exponential function terms of time and a plurality of coefficients, stopping charge or discharge operation for a predetermined time, measuring a battery voltage over time during the time and using an obtained relation between the battery voltage and the time as a basis to determine the coefficients; and determining at least one power coefficient of inferior logarithm of the exponential function terms by expressing the coefficient as a predetermined function of another specified power coefficient.

Further, a twelfth aspect of the present invention is a battery power source system of the above-mentioned eleventh aspect, in which the voltage estimating unit operates to allow a time between stopping of the charge operation and starting of measuring of the battery voltage to reduce the exponential function terms in number.

Effects of the Invention

As described above, according to the present invention, a stable open circuit voltage estimated value after a lapse of desired time is obtained by the step of using an approximate function including a plurality of exponential function terms of time and a plurality of coefficients, stopping charge and discharge operation for a predetermined time, measuring the battery voltage over time in the meantime, determining the coefficients based on the obtained battery voltage-time relation, and the step of determining at least one power coefficient of inferior logarithm in each of the exponential function terms based on temperature by expressing the coefficient as a previously obtained function of temperature.

Besides, a stable open circuit voltage estimated value after a lapse of desired time is obtained by the step of using an approximate function including a plurality of exponential function terms of time and a plurality of coefficients, stopping charge or discharge operation during a predetermined time, measuring battery voltage over time in the meantime and using the obtained relation between the battery voltage and the time as a basis to determine the coefficients; and the step of determining at least one power coefficient of inferior logarithm of the exponential function terms by expressing the coefficient as a predetermined function of another specified power coefficient.

With these structures, it is possible to estimate a remaining electrical charge or a remaining capacity of a battery with high calculation accuracy and in a short time.

DESCRIPTION OF THE SYMBOLS

10 Secondary battery
11 Charge circuit
12 Voltage sensor
13 Controller
14 Storage
4, 20 Load

BEST MODE FOR CARRYING OUT THE INVENTION

Description will now be made about preferred embodiments of the present invention with reference to the drawings. This embodiment deals with a case where the present invention is applied to a vehicle battery system having a function of estimating a remaining electrical charge of a secondary battery mounted on a vehicle such as an auto car or a secondary battery for power source of various devices, backup of various devices or the like.

Figure 1:
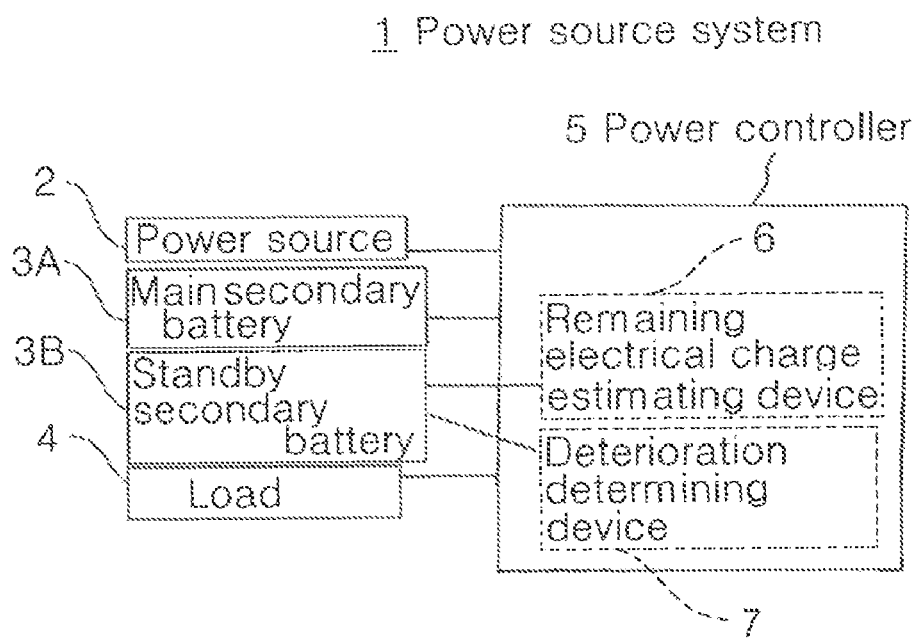
FIG. 1 is a block diagram schematically illustrating a configuration of a battery system of the present embodiment.

FIG. 1 is a block diagram schematically illustrating a configuration of a vehicle battery system or a secondary battery system for power source of various devices, backup of various devices or the like of this embodiment. In FIG. 1, there are plural batteries, which are a master secondary battery 3A and a standby secondary battery 3B and the system is presented for estimating at least one of the batteries. Besides, there is provided a power controller 5 which may be connected to a power source 2 of solar battery, vehicle electric generator or the like.

Also in FIG. 1, the power controller 5 and a remaining electrical charge estimating device 6 have a storing unit 6a for storing a history of a secondary battery and a controlling/determining unit having a program for continuously determining and/or holding the history of the secondary battery which can be charged to be reused or used continuously. Besides, there may be provided with a deterioration determining device 7 determining deterioration.

Further, in FIG. 1, the system may be configured to estimate each remaining electrical charge of at least two secondary batteries 3A and 3B and send the remaining electrical charge of the secondary batteries 3A and 3B and/or information about the necessity to exchange or charge batteries or information about the possibility to use the batteries continuously to a user or the like via a connector or wireless communication (not shown) of the power controller 5 or the remaining electrical charge estimating device 6 or via a display device (not shown).

With this configuration, at least one of the batteries remains always usable.

Figure 2:
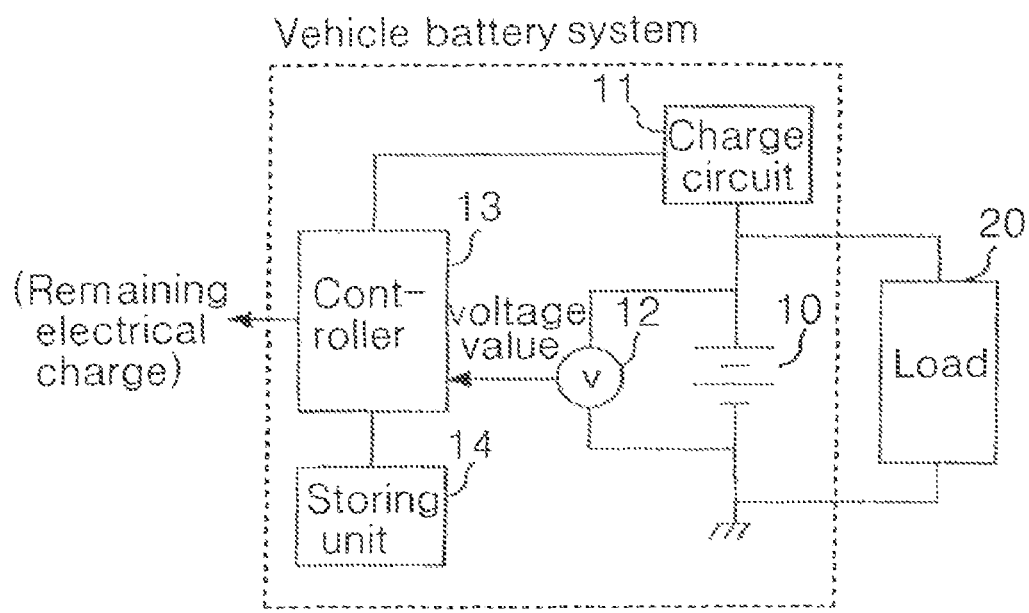
FIG. 2 is a block diagram schematically illustrating a configuration of a vehicle battery system of the present embodiment.

FIG. 2 is a block diagram schematically illustrating a configuration of a vehicle battery system according to this embodiment. In FIG. 2, the system includes a secondary battery 10, a charge circuit 11, a voltage sensor 12, a controller 13 and a storing unit 14, and is configured to supply power to a load 20 of a motor, various devices and the like from the secondary battery 10.

In the configuration of FIG. 2, used as the secondary battery 10 to supply power to the load 20 mounted on the vehicle is, for example, a lead battery for vehicle. Receiving an instruction of charge operation from the controller 13, the charge circuit 11 makes a predetermined charge current flow to charge the secondary battery 10. The voltage sensor 12 detects a voltage applied to the secondary battery 10 and sends the voltage value to the controller 13.

Further, the controller 13 is configured of a CPU or the like to control the operation of the whole vehicle power system and to execute calculation for estimating a remaining electrical charge at a predetermined timing, as described later, to send the obtained remaining electrical charge to a controller of the vehicle or the like. Then, the storing unit 14 connected to the controller 13 includes a ROM storing in advance various programs including a control program, and a RAM storing temporarily data required for processing in the controller 13.

Next description is made about the principle of estimating a remaining electrical charge of the secondary battery 10 in the vehicle battery system of this embodiment. As described above, the remaining electrical charge of the secondary battery 10 is in a strong correlation with an open circuit voltage of the secondary battery 10 and thus, estimation of the remaining electrical charge of the secondary battery 10 can be obtained by the open circuit voltage. However, charge and discharge of the secondary battery 10 is repeatedly carried out continuously and the secondary battery 10 often contains polarization. In order to estimate an accurate remaining electrical charge of the secondary battery 10, it is necessary to obtain a convergence value of the voltage of the secondary battery 10 which has no polarization, however, it takes extremely long time, for example, several tens of hours, or several days to utilize time lapse to eliminate polarization. Therefore, it is difficult to measure an open circuit voltage of the secondary battery 10 in a stable state. In this embodiment, a function capable of approximating an open circuit voltage with change in time highly-accurately is used, coefficients of the function are determined by iterating calculation and the coefficients are used at least as a basis to estimate a convergence value of the open circuit voltage in a short time.

In this embodiment, it is assumed that the function for approximating the open circuit voltage with change in time of the secondary battery 10 is a $4^{th}$ order or more exponential decay function. The equation (1) is an equation for generally expressing the $4^{th}$ order exponential decay function $$Y = a1\exp(-b1X) + a2\exp(-b2X) + a3\exp(-b3X) + a4\exp(-b4X) + c \quad (1)$$

where a1, a2, a3, a4, b1, b2, b3, b4 and c are coefficients.

In the equation (1), an input X is elapsed time and an output Y is an open circuit voltage. The open circuit voltage of the secondary battery 10 at any time can be approximated by determining the above-mentioned coefficients.

Further in this embodiment, generally used as a function for approximating an open circuit voltage of the secondary battery 10 with change in time is an $N^{th}$ order exponential decay function, which is given below.

$$Y = a1\exp(-b1X) + a2\exp(-b2X) + a3\exp(-b3X) + a4\exp(-b4X) + \ldots + an\exp(-bnX) + c \quad (2)$$

where in the equation (2) a1, a2, ..., an, b1, b2, ..., bn and c are coefficients.

In the equation (2), an input X is elapsed time and an output Y is an open circuit voltage. The open circuit voltage of the secondary battery 10 at any time can be approximated with high accuracy by determining the above-mentioned coefficients.

Here, in this embodiment, when the open circuit voltage is approximated based on the equation (1), a certain level of accuracy can be assured by setting "n" at $4^{th}$ or more.

Further, it is experimentally confirmed that when the open circuit voltage is approximated based on the equation (2), sufficient accuracy can be assured by setting "n" at $4^{th}$ or more. With this confirmation, the following description is given on the precondition that "n" in the equation (2) is 4 and the $4^{th}$ order exponential decay function is used.

Figure 3:
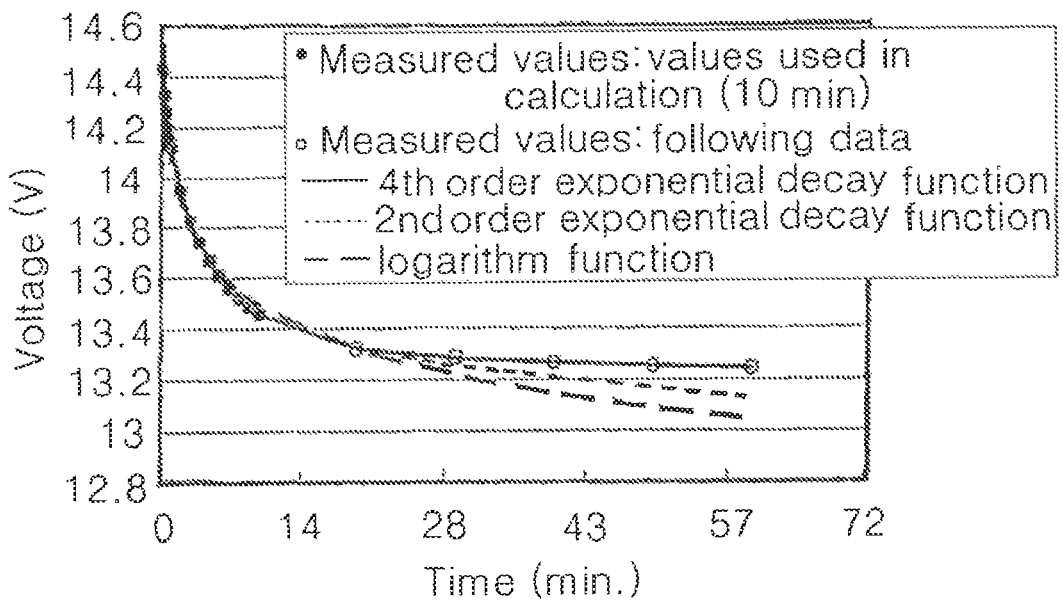
FIG. 3 is a graph showing the time characteristic of the open circuit voltage after charge of the secondary battery, and also showing a specific example of approximating the open circuit voltage using an exponential decay function.

FIG. 3 is a graph showing time characteristics of open circuit voltages over 60 minutes after charge of the secondary battery 10, the graph including a specific example of open circuit voltages obtained by approximation with use of the $4^{th}$ order exponential decay function. FIG. 3 also shows a conventional way of using logarithm function for comparison and actual measurement values of open circuit voltage of the secondary battery 10 are plotted therein. In FIG. 3, the $4^{th}$ order exponential decay function is based on the following equation (3) obtained by iterating calculation of each coefficient using actual measurement values over ten minutes after finish of charge.

$$Y = 1.80933\exp(-X/4.65331) + 0.2895\exp(-X/0.41691) - \\ 0.90055\exp(-X/4.65129) + 0.9\exp(-X/0.004) + 13.35703 \quad (3)$$

In addition, the logarithm function of the conventional way of FIG. 3 is based on the following equation (4) with optimal coefficients determined on the same conditions.

$$Y = -0.2517\ln(X) + 14.072 \quad (4)$$

As shown in FIG. 3, the open circuit voltages obtained by the conventional logarithm function show differences from the actual measurement values while the open circuit voltages obtained by the $4^{th}$ order exponential decay function of this embodiment are in agreement with the plotted actual measurement values. Here, the open circuit voltages obtained by the $2^{nd}$ order exponential decay function show smaller difference from the actual measurement values than the open circuit voltages obtained by the logarithm function.

As shown in FIG. 3, the difference becomes larger with the passage of time for the conventional logarithm function, and the difference is significantly large at the point where voltages of the secondary battery 10 converge. Then, correlation coefficients between the actual measurement values and the open circuit voltages obtained by the conventional logarithm function and between the actual measurement values and the open circuit voltages obtained by the $4^{th}$ order exponential decay function are calculated with a result of $R^2=0.9865$ for the conventional logarithm function and $R^2=0.99998$ for the $4^{th}$ order exponential decay function of this embodiment, showing significant improvement of the accuracy. This result confirms that the $4^{th}$ order exponential decay function of this embodiment returns more approximate open circuit voltages than the conventional logarithm function and assures enhancement of estimation accuracy of the remaining electrical charge.

Figure 4:
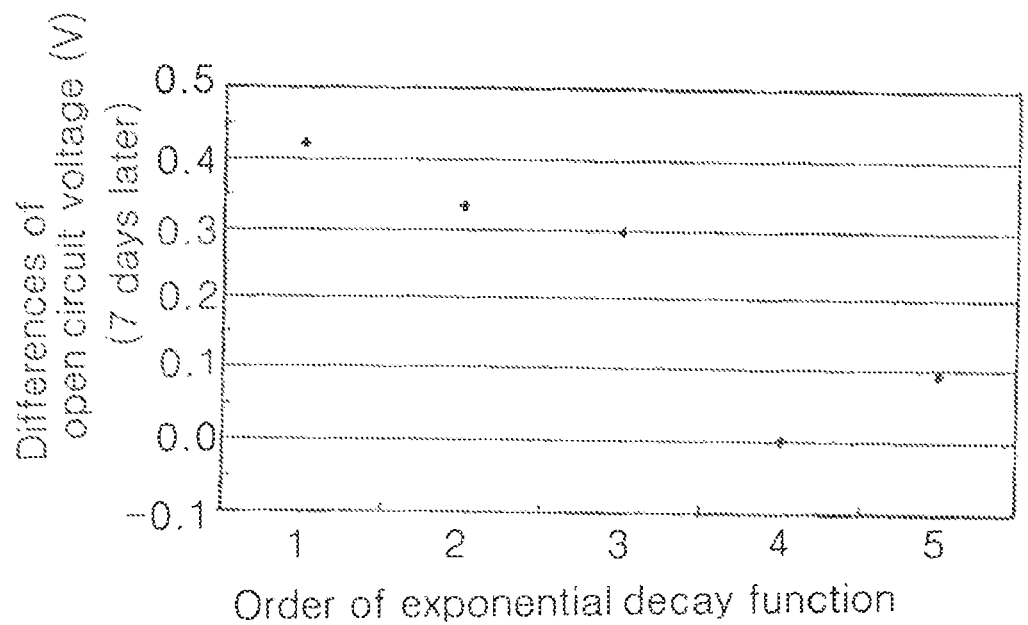
FIG. 4 is a graph showing a relation between the order and the accuracy in the case of approximating the open circuit voltage with the exponential decay function used in the present embodiment.

Next description is made with reference to FIG. 4 about the relation between the order and accuracy when the above exponential decay function is used to calculate out approximate open circuit voltages. In the $n^{th}$-order exponential decay function expressed in the above equation (2), the value of "n" is set to vary from 1 to 5 and voltage data of the secondary battery 10 obtained over 10 minutes after finish of charge is used to determine optimal coefficients for calculation of the open circuit voltages. Then, a difference of an open circuit voltage after 7 days for each order is calculated and plotted as shown in FIG. 4.

As shown in FIG. 4, when the order of the exponential decay function of the equation (2) is 1, the difference becomes relatively large. For the $2^{nd}$ order and $3^{rd}$ order exponential decay functions, the differences are acceptable, and the differences of the $4^{th}$ order and $5^{th}$ order exponential decay functions show sufficiently small. This result shows that when the order of the exponential decay function needs to be 2 or more to assure a certain level of accuracy and sufficiently high accuracy can be achieved for the $4^{th}$ order or more exponential decay function. Meanwhile, as described later, when iterating calculation is performed with use of an exponential decay function, it is necessary to reduce calculation as much as possible and therefore, in this embodiment, the $4^{th}$ order exponential decay function is adopted in view of the balance between high accuracy and less calculation.

When calculation starts, initial settings of parameters necessary for operation by the controller 13 are performed. The parameters for initial settings include a sampling interval $\Delta Ts$ in obtaining voltage sample values of the secondary battery 10, a number of samples Ns and a stable time period Tx required for obtaining a stable open circuit voltage of the secondary battery 10. The initial settings are, for example, $\Delta Ts=10$ (sec.), Ns=60 (samples) and Tx=100000 (sec.). In this case, the initial settings may be fixed depending on the characteristics of the secondary battery 10 or may be changed depending on the operating conditions.

Then, the controller 13 sequentially reads measured voltages output from the voltage sensor 12 at predetermined timings and obtains a plurality of voltage sample values of the secondary battery 10 on the time axis. The above-mentioned initial settings are used as a basis to sequentially obtain Ns voltage sample values measured at the sampling interval ΔTs. The controller 13 sequentially stores the obtained voltage sample values in the storing unit 14 and reads out them when necessary. In the following description, the $n^{th}$ obtained voltage sample values (n=1, 2, 3, ... Ns) are denoted by V(n).

Next, the obtained V(n) is used to calculate out coefficients of the $4^{th}$ order exponential decay function for obtaining approximate open circuit voltages of the secondary battery 10. In this calculation, used as the above-mentioned $4^{th}$ order exponential decay function in calculation is F(T) where T is time, expressed by the following equation (5).

$$F(T)=A1\exp(A5T)+A2\exp(A6T)+A3\exp(A7T)+A4\exp(A8T)+A9 \quad (5)$$

A feature of the first embodiment of the present invention is, when estimating a stable open circuit voltage by fitting with the equation (5), first obtaining at least one of relaxation time coefficients in the equation (5), that is, coefficients A5, A6, A7, A8, antilog of inferior logarithm as the temperature function $f_1(t)$, $f_2(t)$, $f_3(t)$, $f_4(t)$ and then performing fitting calculation with a relaxation time coefficient at each temperature being a fixed value.

In this embodiment, it is assumed that the coefficients A5, A6, A7 and A8 are expressed by temperature functions. Then, the exponential decay function is expressed by the equation (6) and t in the function $f_1(t)$, $f_2(t)$, $f_3(t)$, $f_4(t)$ denotes temperature.

$$F(T)=A1\exp\{f_1(t)T\}+A2\exp\{f_2(t)T\}+A3\exp\{f_3(t)T\}+A4\exp\{f_4(t)T\}+A9 \quad (6)$$

If $f_1(t)$, $f_2(t)$, $f_3(t)$ and $f_4(t)$ in the equation (6) are obtained in advance by experiment and a temperature at a certain point is obtained, $f_1(t)$, $f_2(t)$, $f_3(t)$ and $f_4(t)$ can be treated as fixed values. The exponential decay function in this case is given by the equation (7).

$$F(T)=A1B1^T+A2B2^T+A3B3^T+A4B4^T+A5 \quad (7)$$

Then, the above-mentioned exponential decay function F(T) is applied to each $n^{th}$ sample timing to calculate F(n) expressed by the equation (8). Here, the elapsed time T is given by T=nΔTs.

$$F(n)=A1B1^{n\Delta Ts}+A2B2^{n\Delta Ts}+A3B3^{n\Delta Ts}+A4B4^{n\Delta Ts}+A5 \quad (8)$$

Coefficients to be obtained in the equation (8) are A1, A2, A3, A4 and A5. In order that the obtained V(n) is used to obtain the above-mentioned coefficients A1, A2, A3, A4 and A5 by the least-square method, the following linear simultaneous equation (9) has to be solved.

Since the equation (9) is a linear simultaneous equation, it is possible to derive an analytical solution uniquely without occurrence of any local answer and divergence which are problems of nonlinear simultaneous equation. In addition, as the linear simultaneous equation does not need iterating calculation by change of numeric values, it is possible to obtain coefficients with extremely less calculation load.

Here, this embodiment deals with a case of calculating out coefficients of the $4^{th}$ order exponential decay function by the least-square method, however, the coefficients may be obtained by Kalman Filter or well-trained neutral network.

When the coefficients A1, A2, A3, A4 and A5 of the equation (8) are obtained by the neutral network, appropriate network such as Multi-Layer Perceptron is selected, appropriate and sufficient teaching signal is trained by back propagation and thereby, arbitral V(n) and temperature t are used as inputs thereby to output appropriate coefficients A1, A2, A3, A4 and A5.

In addition, as the equation (8) is a linear Gaussian model suitable for Kalman Filter calculation, the state vector is given by $Xn^T=(A1 \cdot B1^{n \cdot \Delta Ts}, A2 \cdot B2^{n \cdot \Delta Ts}, A3 \cdot B3^{n \cdot \Delta Ts}, A4 \cdot B4^{n \cdot \Delta Ts}, A5)$, and observation values are given by Yn=V(n), $H^T=(1,1,1,1,1)$ and Jacobian is given by $F=\text{diag}(B1^{\Delta Ts}, B2^{\Delta Ts}, B3^{\Delta Ts}, B4^{\Delta Ts}, 1)$, and thereby it is possible to use a state space expression as given by the equation (10).

$$X_n=FX_{n-1}$$
$$Y_n=HX_n \quad (10)$$

Then, the Kalman Filter calculation, which is repetition of one-period ahead forecast, Kalman gain calculation and Filtering calculation in this order is performed thereby to successively renew Xn, that is, coefficients A1, A2, A3, A4 and A5.

The coefficients A1, A2, A3, A4 and A5 calculated out by this calculation method are used as a basis to calculate by use of the following equation (11) a convergence value V0 of the open circuit voltage of long-term stability.

$$V0=A1B1^{Tx}+A2B2^{Tx}+A3B3^{Tx}+A4B4^{Tx}+A5 \quad (11)$$

Here, for easy explanation, the relation V0=A5 may be established without problems.

Then, the obtained convergent value V0 of the open circuit voltage is used as a basis to calculate a remaining electrical charge of the secondary battery 10. Generally, the remaining electrical charge of the secondary battery 10 can be obtained, without exception, based on the convergent value V0 of the open circuit voltage and an ambient air temperature by way of a given function. Then, as the function suitable for the secondary battery 10 is determined in advance, the remaining electrical charge of the secondary battery 10 can be estimated.

$$\begin{pmatrix} \sum_{n=1}^{Ns} V(n) \cdot B1^{n \cdot \Delta Ts} \\ \sum_{n=1}^{Ns} V(n) \cdot B2^{n \cdot \Delta Ts} \\ \sum_{n=1}^{Ns} V(n) \cdot B3^{n \cdot \Delta Ts} \\ \sum_{n=1}^{Ns} V(n) \cdot B4^{n \cdot \Delta Ts} \\ \sum_{n=1}^{Ns} V(n) \end{pmatrix} = \begin{pmatrix} \sum_{n=1}^{Ns} B1^{2n \cdot \Delta Ts} & \sum_{n=1}^{Ns} B1^{n \cdot \Delta Ts} \cdot B2^{n \cdot \Delta Ts} & \sum_{n=1}^{Ns} B1^{n \cdot \Delta Ts} \cdot B3^{n \cdot \Delta Ts} & \sum_{n=1}^{Ns} B1^{n \cdot \Delta Ts} \cdot B4^{n \cdot \Delta Ts} & \sum_{n=1}^{Ns} B1^{n \cdot \Delta Ts} \\ \sum_{n=1}^{Ns} B1^{n \cdot \Delta Ts} \cdot B2^{n \cdot \Delta Ts} & \sum_{n=1}^{Ns} B2^{2n \cdot \Delta Ts} & \sum_{n=1}^{Ns} B2^{n \cdot \Delta Ts} \cdot B3^{n \cdot \Delta Ts} & \sum_{n=1}^{Ns} B2^{n \cdot \Delta Ts} \cdot B4^{n \cdot \Delta Ts} & \sum_{n=1}^{Ns} B2^{n \cdot \Delta Ts} \\ \sum_{n=1}^{Ns} B1^{n \cdot \Delta Ts} \cdot B3^{n \cdot \Delta Ts} & \sum_{n=1}^{Ns} B2^{n \cdot \Delta Ts} \cdot B3^{n \cdot \Delta Ts} & \sum_{n=1}^{Ns} B3^{2n \cdot \Delta Ts} & \sum_{n=1}^{Ns} B3^{n \cdot \Delta Ts} \cdot B4^{n \cdot \Delta Ts} & \sum_{n=1}^{Ns} B3^{n \cdot \Delta Ts} \\ \sum_{n=1}^{Ns} B1^{n \cdot \Delta Ts} \cdot B4^{n \cdot \Delta Ts} & \sum_{n=1}^{Ns} B2^{n \cdot \Delta Ts} \cdot B4^{n \cdot \Delta Ts} & \sum_{n=1}^{Ns} B3^{n \cdot \Delta Ts} \cdot B4^{n \cdot \Delta Ts} & \sum_{n=1}^{Ns} B4^{2n \cdot \Delta Ts} & \sum_{n=1}^{Ns} B4^{n \cdot \Delta Ts} \\ \sum_{n=1}^{Ns} B1^{n \cdot \Delta Ts} & \sum_{n=1}^{Ns} B2^{n \cdot \Delta Ts} & \sum_{n=1}^{Ns} B3^{n \cdot \Delta Ts} & \sum_{n=1}^{Ns} B4^{n \cdot \Delta Ts} & Ns \end{pmatrix} \times \begin{pmatrix} A1 \\ A2 \\ A3 \\ A4 \\ A5 \end{pmatrix} \quad (9)$$

The second embodiment of the present invention has its second feature in, when estimating a stable open circuit voltage by fitting with the function expressed by the equation (5), first calculating a correlation between relaxation time coefficients in the equation (5), that is, antilogs of inferior logarithm and then, performing fitting calculation, for example, with at least one of the coefficients A6, A7 and A8 used as functions $g_1(A5)$, $g_2(A5)$ and $g_3(A5)$ of the coefficient A5.

In this embodiment, all of the A6, A7 and A8 are expressed by the functions with the coefficient A5, that is, $g_1(A5)$, $g_2(A5)$, $g_3(A5)$, and for easy explanation, it is assumed that the relations A6=αA5, A7=βA5, A8=γA5 are satisfied for example. In this case, the exponential decay function is given by the equation (12) where α, β, γ are constants obtained in advance by experiment or the like.

$$F(T)=A1\exp(A5T)+A2\exp(\alpha A5T)+A3\exp(\beta A5T)+A4\exp(\gamma A5T)+A6 \quad (12)$$

Next, the above-described exponential decay function F(T) is adopted to each of $N^{th}$ sample timing to calculate the following F(n) expressed by the equation (13). Here, elapsed time T is give by T=nΔTs.

$$F(n) = A1\exp(A5\,n\Delta Ts) + A2\exp(aA5\,n\Delta Ts) + \\ A3\exp(\beta A5\,n\Delta Ts) + A4\exp(\gamma A5\,n\Delta Ts) + A6 \quad (13)$$

The coefficients to be obtained in the equation (12) are A1, A2, A3, A4, A5 and A6. In order to obtain these coefficients A1, A2, A3, A4, A5 and A6 with use of the obtained V(n) by least-square method, the following nonlinear simultaneous equation (14) is solved.

$$\sum_{n=1}^{Ns} [\exp(A5 \cdot n\Delta Ts) \cdot \{V(n) - F(n)\}] = 0 \quad (14)$$

$$\sum_{n=1}^{Ns} [\exp(\alpha A5 \cdot n\Delta Ts) \cdot \{V(n) - F(n)\}] = 0$$

$$\sum_{n=1}^{Ns} [\exp(\beta A5 \cdot n\Delta Ts) \cdot \{V(n) - F(n)\}] = 0$$

$$\sum_{n=1}^{Ns} [\exp(\gamma A5 \cdot n\Delta Ts) \cdot \{V(n) - F(n)\}] = 0$$

$$\sum_{n=1}^{Ns} [n\Delta Ts \cdot \{\exp(A5 \cdot n\Delta Ts) + \exp(\alpha A5 \cdot n\Delta Ts) + \exp(\beta A5 \cdot n\Delta Ts) + \\ \exp(\gamma A5 \cdot n\Delta Ts)\} \cdot \{V(n) - F(n)\}] = 0$$

$$\sum_{n=1}^{Ns} \{V(n) - F(n)\} = 0$$

In order to solve the equation (14), iterating calculation of Gauss-Newton method, Levenberg-Marquardt method or the like may be performed. In this case, the calculation is more complicated than that in the first embodiment however the calculation load is still low enough to solve the equation.

Further, like in the first embodiment, the Extended Kalman Filter or neutral network may be used to obtain the coefficients A1, A2, A3, A4, A5 and A6 without problems.

As explained up to this point, in the vehicle battery system of this embodiment, the remaining electrical charge of the secondary battery 10 estimated by the above-mentioned calculation is sent to a controller to the like of the vehicle and may be utilized in variable forms. For example, when the remaining electrical charge is smaller than a given value, an alarm is displayed, or the remaining electrical charge itself may be displayed. In this case, as the above-mentioned calculation is performed with high accuracy, the remaining electrical charge can be always estimated accurately and hence, the vehicle battery system is realized as a highly-reliable, easy-to-use one.

Figure 5:
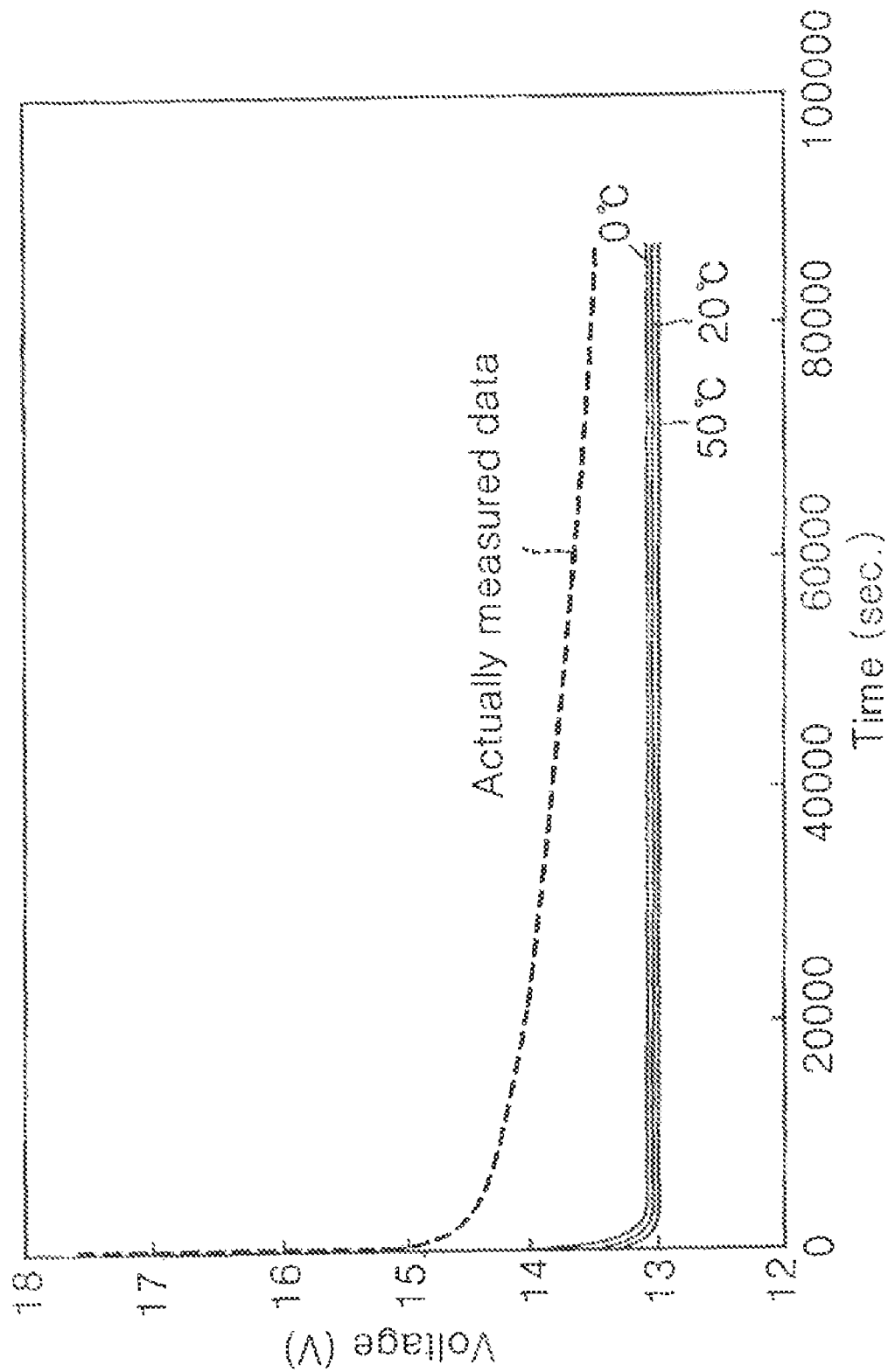
FIG. 5 is a graph of the time characteristic of the open circuit voltage in which the relaxation time terms in the $4^{th}$ order exponential decay function are obtained as functions of temperature in the present embodiment.

The solid lines shown in FIG. 5 indicate time characteristics at the temperatures 0° C., 20° C. and 50° C. and the broken line indicates values obtained by actual measurement. As seen from this graph, a convergent value of the open circuit voltage of the secondary battery can be obtained in a short time.

Next description is made about the third embodiment of the present invention. As described above, in the vehicle battery system of the embodiments, the open circuit voltage is obtained by approximation with $4^{th}$ order or more exponential decay function for keeping high accuracy in iterating calculations. However, even if the $4^{th}$ order or more exponential decay function is set, a lower order exponential decay function can be used to perform iterating calculation depending on conditions of the vehicle battery system. The description below is made about, as a modification of the embodiment, a specific calculation method of using substantially-lower-order exponential decay function to realize reduction in calculation load.

In the third embodiment, utilizing different influence between terms of the exponential decay function depending on the timings to obtain the plural sample voltages (hereinafter referred to as "voltage measurement timing") a given time along the time axis after charge and discharge of the secondary battery 10 is stopped, calculation is performed with an exponential decay function from which is removed a term that has become sufficiently small with time elapsed. Here, as a specific example of this embodiment, it is assumed that the secondary battery 10 is a vehicle lead seal battery. Here, the $4^{th}$-order exponential decay function suitable for the secondary battery 10 is determined and an approximate expression used in successive calculation is give by the following equation (15).

$$Y = 1.01707\exp(-0.2328 \cdot T) + \\ 0.38436\exp(-0.02577 \cdot T) + 0.15783\exp(-8.0717E - 4 \cdot T) + \\ 0.12104\exp(-1.8876E - 5 \cdot T) + 12.7216 \quad (15)$$

Figure 6:
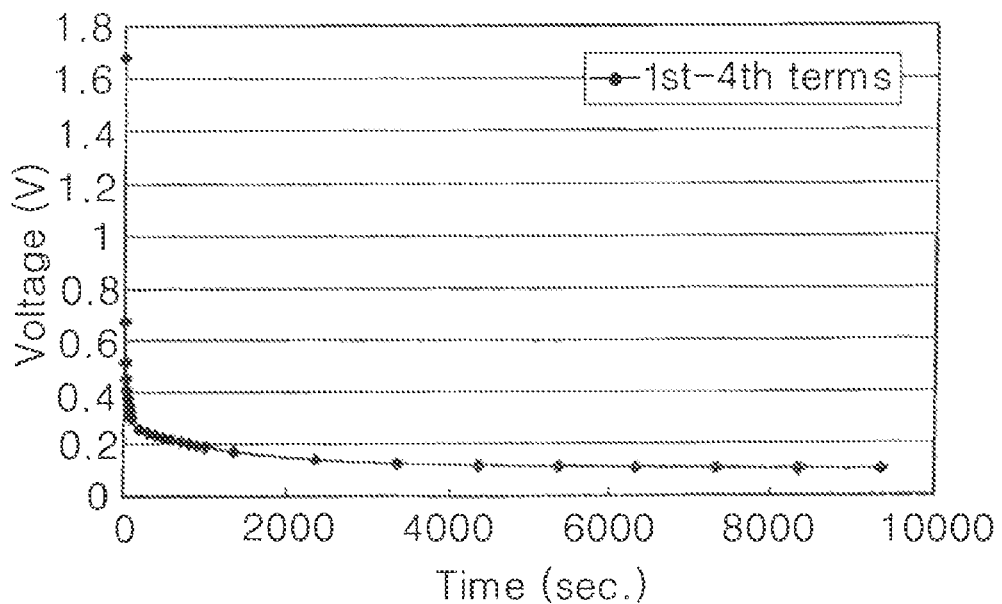
FIG. 6 is a graph of the time characteristic of the open circuit voltage where all of the first to fourth terms are included in the $4^{th}$ order exponential decay function in a modification of the present embodiment.

Then, in relation to the above equation (15), time characteristics of open circuit voltages are examined on the first to fourth terms of the equation. Results of this examination are shown in FIGS. 6 to 10. First, FIG. 6 shows a time characteristic of the case including all components of the first to fourth terms except for the constant term, which is calculated out from the following equation (16).

$$Y = 1.01707\exp(-0.2328T) + 0.38436\exp(-0.02577T) + \\ 0.15783\exp(-8.0717E - 4T) + 0.12104\exp(-1.8876E - 5T) \quad (16)$$

As shown in FIG. 6, each of the terms decays over time and the open circuit voltage converges on zero. However, over a short time period after the processing starts, there is an influence of change of the equation (16).

Figure 7:
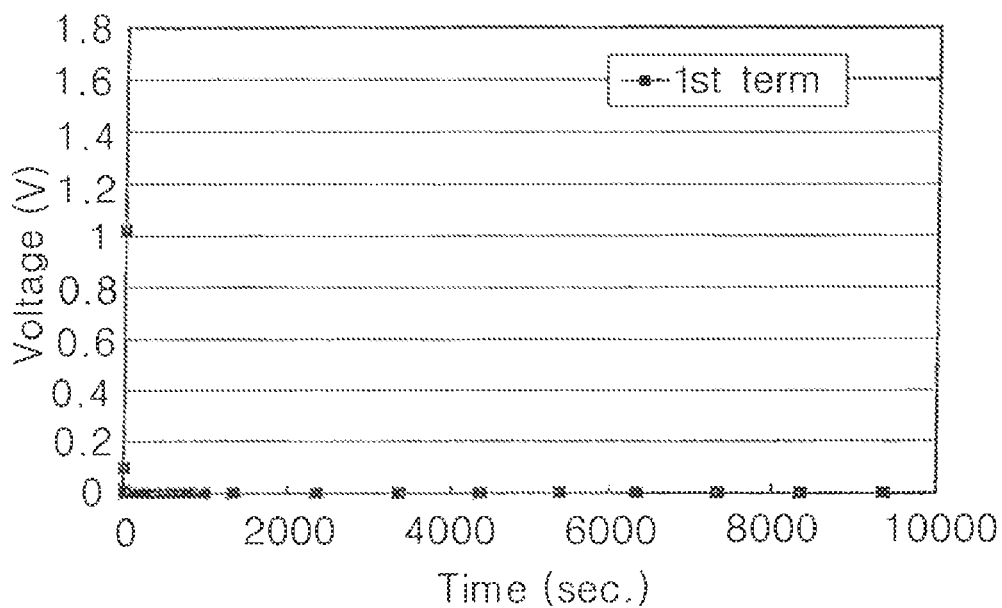
FIG. 7 is a graph of the time characteristic of the open circuit voltage where the first term is only included in the $4^{th}$ order exponential decay function in a modification of the present embodiment.

Next, FIG. 7 shows a time characteristic of the case including only component of the first term in the equation (16), which is calculated out from the following equation (17).

$$Y=1.01707\exp(-0.2328T) \quad (17)$$

Figure 8:
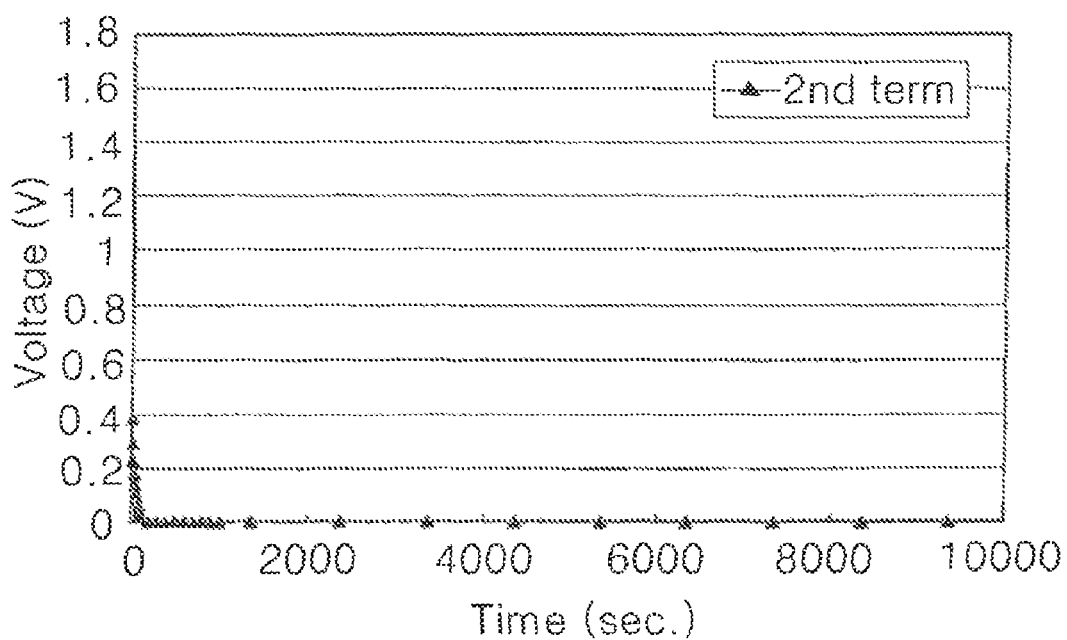
FIG. 8 is a graph of the time characteristic of the open circuit voltage where the second term is only included in the $4^{th}$ order exponential decay function in a modification of the present embodiment.
Figure 9:
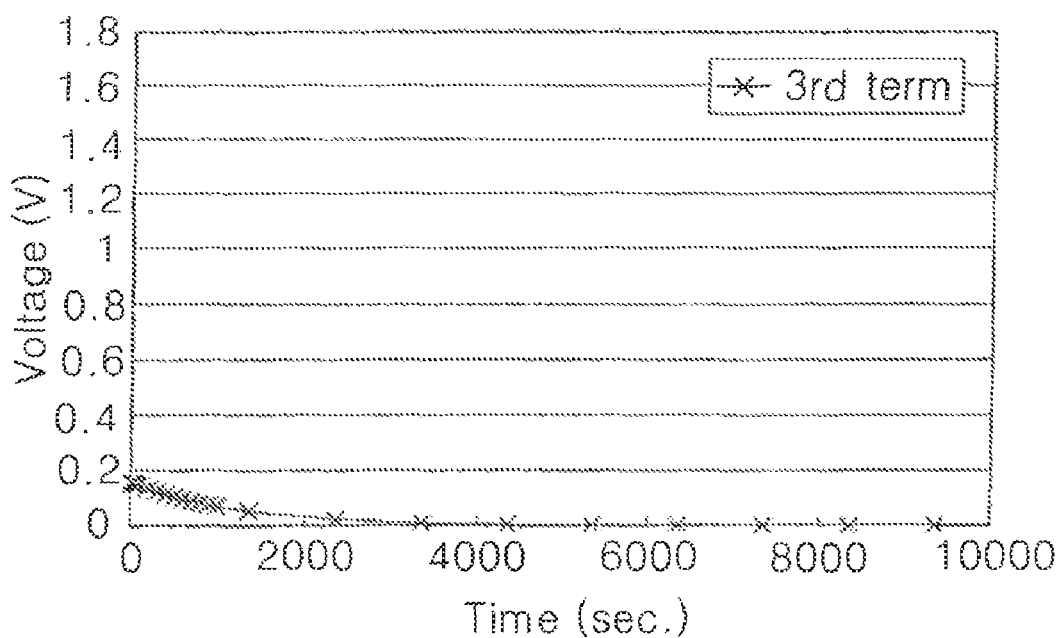
FIG. 9 is a graph of the time characteristic of the open circuit voltage where the third term is only included in the $4^{th}$ order exponential decay function in a modification of the present embodiment.
Figure 10:
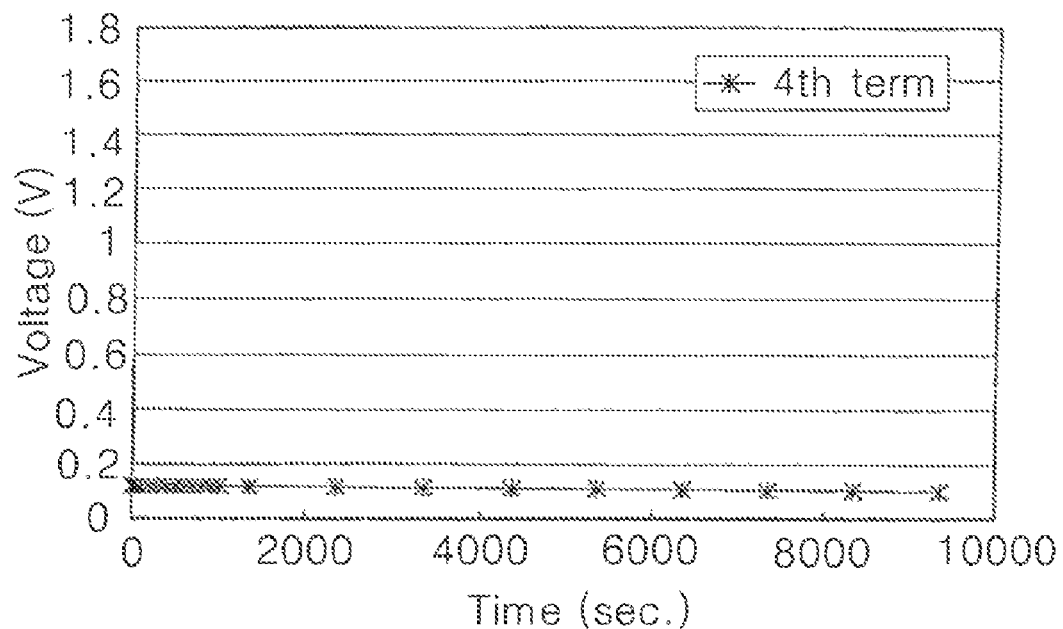
FIG. 10 is a graph of the time characteristic of the open circuit voltage where the fourth term is only included in the $4^{th}$ order exponential decay function in a modification of the present embodiment.

Likewise, the cases including respective components of the second to fourth terms in the equation (16) are shown in FIGS. 8 to 10, and specifically, FIG. 8 shows a time characteristic of the case including only component of the second term, FIG. 9 shows a time characteristic of the case including only component of the third term and FIG. 10 shows a time characteristic of the case including only component of the fourth term. Besides, the equation (18) corresponding to the time characteristic of FIG. 8, the equation (19) corresponding to the time characteristic of FIG. 9 and the equation (20) corresponding to the time characteristic of FIG. 10 are given below.

$$Y=0.38436\exp(-0.02577T) \quad (18)$$

$$Y=0.15783\exp(-8.0717E\text{-}4T) \quad (19)$$

$$Y=0.12104\exp(-1.8876E\text{-}5T) \quad (20)$$

As shown in FIGS. 7 to 10, the tendency of decay at the initial phase of the time is different between the components of the terms of the equation (15) and after the long time has passed, the voltage converges on zero. At this time, the steepest decay is presented in the case of the first term shown in FIG. 7 and the decay becomes less steep in the order of the second to fourth terms. As seen from comparison of FIGS. 7 to 10 and the equations (17) to (20), the larger the coefficient for the time T is, the more rapidly its term decays.

The third embodiment of the present invention notes a difference of the degree of decay among the terms in the exponential decay function, and aims to realize reduction of calculation by delaying voltage calculation timing in time characteristic and performing calculation with a certain term eliminated. Besides, the relation between the voltage calculation timing and the case, as described above, where it is assumed that the secondary battery 10 is a vehicle lead seal battery and the fourth-order exponential decay function is applied is specifically given in the table 1.

TABLE 1

| voltage measurement timing (sec) | Application of terms of exponential decay function ($4^{th}$ order) |
|---|---|
| 0-10 | $1^{st}$ term + $2^{nd}$ term + $3^{rd}$ term + $4^{th}$ term |
| 10-60 | $2^{nd}$ term + $3^{rd}$ term + $4^{th}$ term |
| 60-600 | $3^{rd}$ term + $4^{th}$ term |
| 600- | $4^{th}$ term |

First, in the applicable condition shown in the table 1, if a voltage sample value is obtained no later than 10 seconds from the stop of charge and discharge of the battery described in the first and second embodiments, the exponential decay function applied thereto includes all components of the first to fourth terms. In such an initial phase, as the influence of each term of the exponential decay function is relatively large, it is necessary to perform calculation of the $4^{th}$ order exponential decay function including all of the four terms in order to keep sufficiently high calculation accuracy.

On the other hand, at the timing of 10 seconds from the stop of charge and discharge, the first term of the exponential decay function decays vanishingly, and the exponential decay function applied is a function with the first term eliminated and the second to fourth terms only included. In addition, at the timing of 60 seconds from the stop of charge and discharge, the first term as well as the second term decay vanishingly, and the exponential decay function applied is a function with the first and second terms eliminated and the third and fourth terms only included. Further, at the timing of 600 seconds from the stop of charge and discharge, the first and second terms as well as the third term decay vanishingly, and the exponential decay function applied is a function with the first to third terms eliminated and the fourth term only included.

Thus, the longer the time duration from the stop of charge and discharge to the voltage measurement timing is, the more the order of the exponential decay function can be reduced and the more the calculation processing can be reduced. Then, it is necessary to determine whether each term of the exponential decay function is included or not within the bounds of satisfying a request for calculation accuracy to be kept for the successive calculation. For example, the tolerances of 5% or better are given and if a calculation result obtained by a certain term is within the tolerances, the term of the exponential decay function is eliminated to perform calculation.

In addition, the time duration between the start of calculation and the voltage measurement timing is sometimes specified under constraints of the vehicle battery system. In other words, in the vehicle battery system, while the processing of the first and second embodiments is performed, regular charge and discharge of the secondary battery 10 is stopped. Therefore, it is necessary to complete the calculation within a predetermined time duration and this necessity sometimes adds constraints to the voltage measurement timing. Hence, it is desirable to determine application conditions of each term of the exponential decay function and the voltage measurement timing in view of both required calculation accuracy and system constraints.

In calculation in the third embodiment, the basis processing flow is the same as those in the first and second embodiments. However, it is necessary to, before obtaining a voltage sample value, measure a time duration from the stop of charge and discharge and monitor arrival of the preset voltage measurement timing. Then, when the processing is executed using the voltage sample value obtained at the voltage measurement timing, calculation is preferably performed with a given term of the fourth-order exponential decay function eliminated.

Here, in the third embodiment it is assumed that the secondary battery 10 is a vehicle lead seal battery. However, other kinds of the secondary battery may be adopted in calculation of this embodiment. In such cases, as the form of the exponential decay function differs depending on the kind and characteristic of the secondary battery 10, the optimal application way needs to be selected.

As described up to this point, this embodiment deals with the case of using the $4^{th}$ order or more exponential decay function to make approximations of the time characteristic of the open circuit voltage of the secondary battery 10. In addition to the $4^{th}$ order or more exponential decay function, another function such as a polynomial function may be used together.

This embodiment also deals with using of the $4^{th}$ order or more exponential decay function for making approximations to obtain a time characteristic of the open circuit voltage of the secondary battery 10. In addition to the $4^{th}$ order or more exponential decay function, another function such as a polynomial function may be used together.

Also in this embodiment, the $4^{th}$ order exponential decay function shown in the equation (5) includes nine coefficients A1 to A9. However, as shown in the equation (21), an exponential decay function including ten coefficients A1 to A10 may be used.

$$F(T)=A1\exp(A5T)+A2\exp(A6T)+A3\exp(A7T)+A4\exp(A8T)-A9T+A10 \quad (20)$$

In the above-mentioned equation (21), there is a term expressed by "−A9 T". This term takes into consideration a time characteristic when certain current is supplied from the secondary battery 10 to the controller 13 or storage 14, for example, after completion of charge. Even in this case, if the ten coefficients A1 to A10 of the equation (21) are determined in calculation, the effects of the present invention can be achieved.

The present embodiment is based on the invention of the method for estimating a remaining electrical charge or remaining capacity of a battery for supplying power to a load, the method including a voltage estimating step of obtaining a stable open circuit voltage estimated value after a lapse of desired time. This voltage estimating step includes a step of using an approximate function including a plurality of exponential function terms of time and a plurality of coefficients, stopping charge or discharge operation during a predetermined time, measuring battery voltage over time during the time and using the obtained relation between the battery voltage and the time as a basis to determine the coefficients; and a step of determining at least one power coefficient of inferior logarithm of the exponential function terms based on temperature by expressing the coefficient as a previously obtained function of temperature.

In addition, the present embodiment is based on the invention of the method for estimating a remaining electrical charge or remaining capacity of a battery for supplying power to a load, the method including a voltage estimating step of obtaining a stable open circuit voltage estimated value after a lapse of desired time. This voltage estimating step includes a step of using an approximate function including exponential function terms of time and multiple coefficients, stopping charge or discharge operation during a predetermined time, measuring battery voltage over time during the time and using the obtained relation between the battery voltage and the time as a basis to determine the coefficients; and a step of determining at least one power coefficient of inferior logarithm of the exponential function terms by expressing the coefficient as a predetermined function of another specified power coefficient.

Furthermore, the present embodiment deals with the case of a vehicle battery system having a configuration of estimating a remaining electrical charge of a secondary battery such as a battery for power supply or for backup of various devices or a vehicle secondary battery mounted on a vehicle. However, the present invention is not limited to such use and is widely applicable to various devices equipped with secondary batteries.

Figure 11:
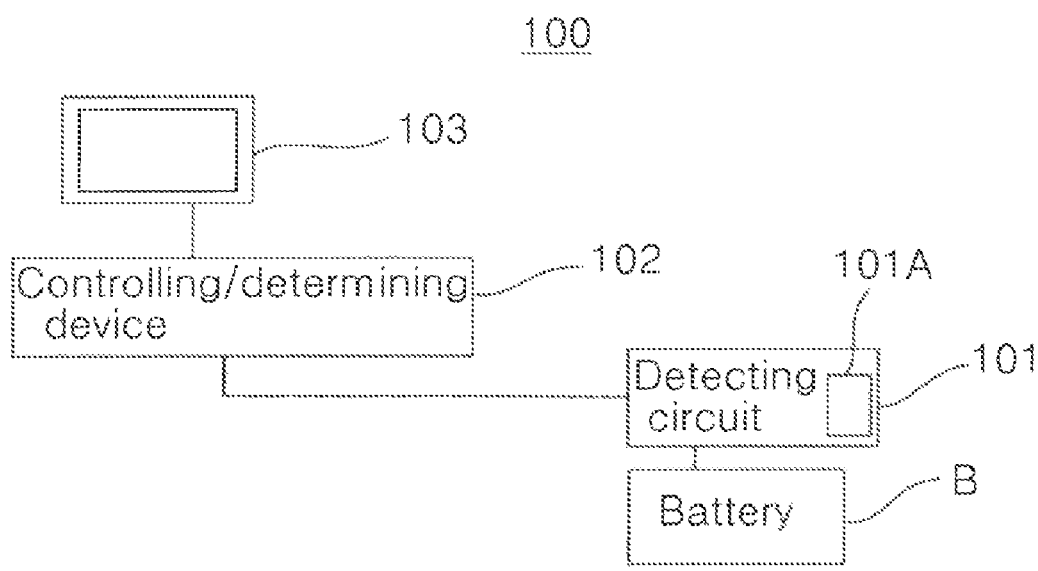
FIG. 11 illustrates a configuration for displaying a remaining electrical charge estimation result and the like in a modification of the present embodiment.

For example, as illustrated in FIG. 11, a system 100 for determining a remaining electrical charge of a secondary battery may have a detecting circuit 101 for obtaining data such as current, voltage, resistance and temperature of a secondary battery B as the secondary battery; a controlling/determining device 102 for receiving the data from the detecting circuit 101 to determine a remaining electrical charge of the secondary battery B; and a display unit 103 for displaying the determination results in various forms. This detecting circuit 101 may have a battery state detecting sensor 101A embedded therein for executing the above-mentioned remaining electrical charge/remaining capacity estimating method.

With such a configuration, the detecting circuit 101 obtains data such as current, voltage, resistance and temperature of the secondary battery B as the secondary battery and communicates the measured data with the controlling/determining device 102.

Then, the controlling/determining device 102 receives the data to determine a remaining electrical charge of the secondary battery B and the display unit 103 displays the determination results in various forms.

Consequently, a user is able to easily grasp a state of the secondary battery as secondary battery.

In this case, a display unit 103 may use combination of two or more of the number of lamps, color, letter, voice and the like to display a state of the secondary battery B as secondary battery, for example, presence or absence of the necessity of exchange, the preferable timing of exchange or the like.

Further, the display unit 103 may display the data on a screen TV monitor, computer display, a display of a GPS device (car navigation) or the like.

Here, a system of communication only by speech may be adopted.

Figure 12:
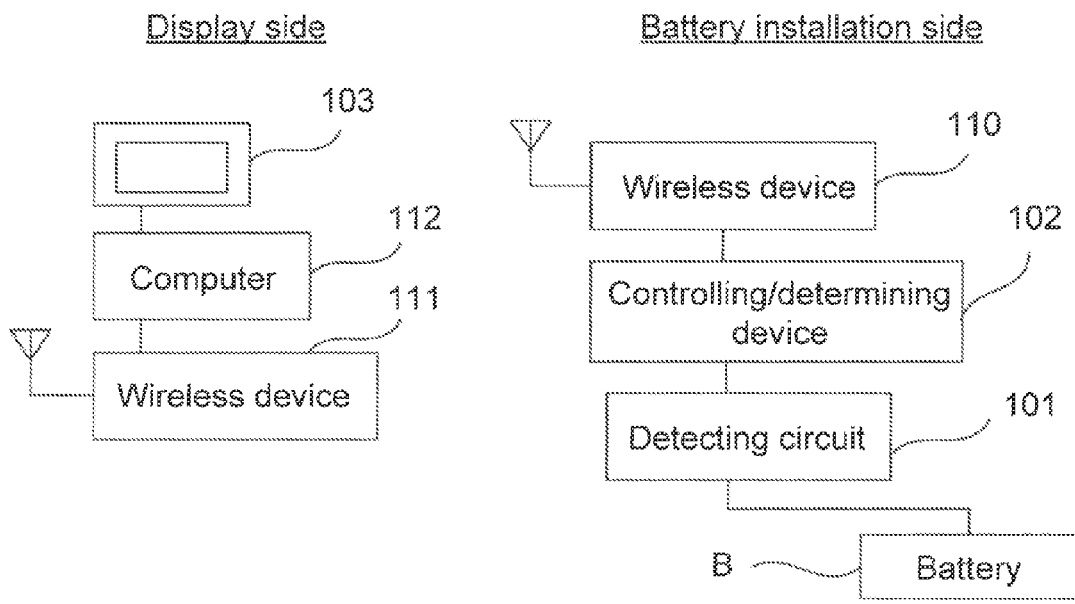
FIG. 12 illustrates a configuration for displaying a remaining electrical charge estimation result and the like via wireless connection between a battery side and a display side in a modification of the present embodiment.

Here, as illustrated in FIG. 12, the detecting circuit 101 for detecting a state of the secondary battery and the controlling/determining device 102 for determining the state of the secondary battery may be arranged to the installation side of the secondary battery and the display unit 103 may be provided at a desired position.

Specifically, the detecting circuit 101 for detecting: a state of the secondary battery and the controlling/determining device 102 for determining the state of the secondary battery are arranged to the installation side of the secondary battery B and the controlling/determining device 102 receives the data from the detecting circuit 101 to determine a remaining electrical charge of the secondary battery B and sends data of the determination results to the display unit 103 via a wireless device 110.

Then, a computer 112 receives the data of the determination results via a wireless device 111 mounted to the display unit 103 side and controls the display unit 103 to display the determination results in various forms.

The controlling/determining device 102 to the secondary battery side shown in FIG. 12 may be omitted, and the data including temperature, voltage and resistance obtained by the detecting circuit 101 may be received at the display side via the wireless device 110 and a controlling/determining device may be provided to the display side or a computer 112 may be used to determine the remaining electrical charge.

With this configuration, for example, a plurality of display units are provided, or a display unit is provided for each of plural parts (secondary battery manufacturers, maintenance bases), and the display units are used to monitor a state of the secondary battery or one display unit is used to monitor and control a plurality of secondary batteries. Then, if a serial number, ID number or the like is assigned to each secondary battery, it is easy to recognize the secondary batteries individually.

Further, the transmission line is not limited to a wired line as shown in FIG. 11 or a wireless line as shown in FIG. 12. For example, a telephone line or network such as internet is used to have information of the charge rate of the secondary battery as electronic mail data (letters, images, voice) displayed via an information terminal such as a portable phone or computer or the like.

Figure 13:
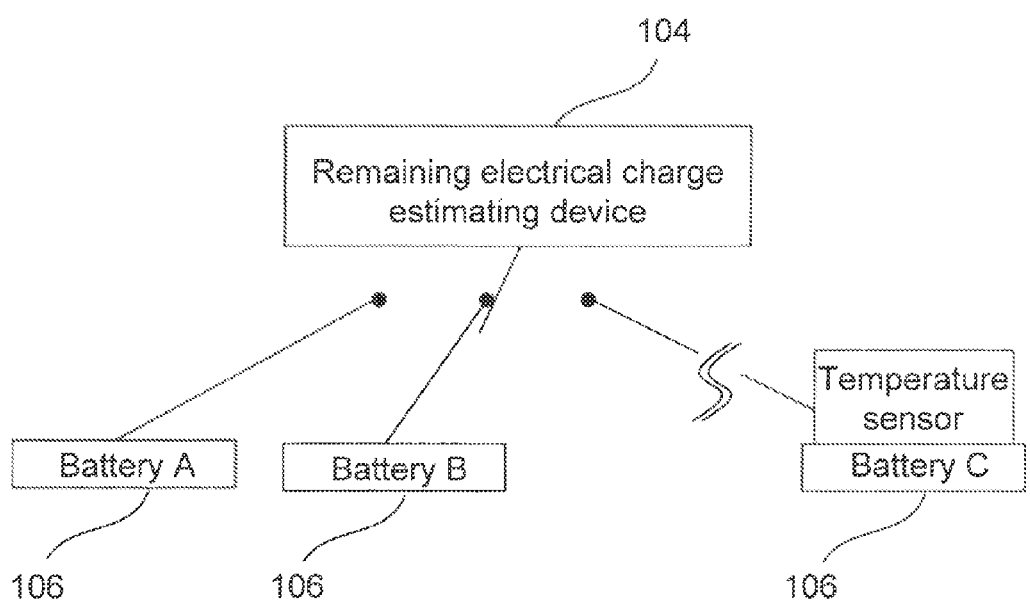
FIG. 13 illustrates an example of making measurement of a plurality of batteries in a modification of the present embodiment.

In addition, provided as another embodiment is a secondary battery remaining electrical charge estimating device 104 having a plurality of secondary batteries provided away from each other as shown in FIG. 13 and being capable of exchanging one circuit or/and controlling the circuit, the secondary batteries A, B and C being switched to be subjected to remaining electrical charge determination. In this case, the electric information (voltage, current, resistance and the like) can be used in determination of the remotely positioned secondary battery remaining electrical charge estimating device, however the temperature measurement is preferably performed by a temperature sensor 105 near the secondary battery or provided for each secondary battery 106. With this configuration, remaining electrical charge determination can be performed on the plural secondary batteries each mounted on an observation device, a communication device or the like, for example. Further, when in the vehicle, a plurality of secondary batteries is provided under a seat, a front or rear storage space or the like, it is possible to determine a remaining electrical charge of at least one of the secondary batteries. Furthermore, the remaining electrical charge determination can be managed by one secondary battery remaining electrical charge estimating device or a computer.

Figure 14:
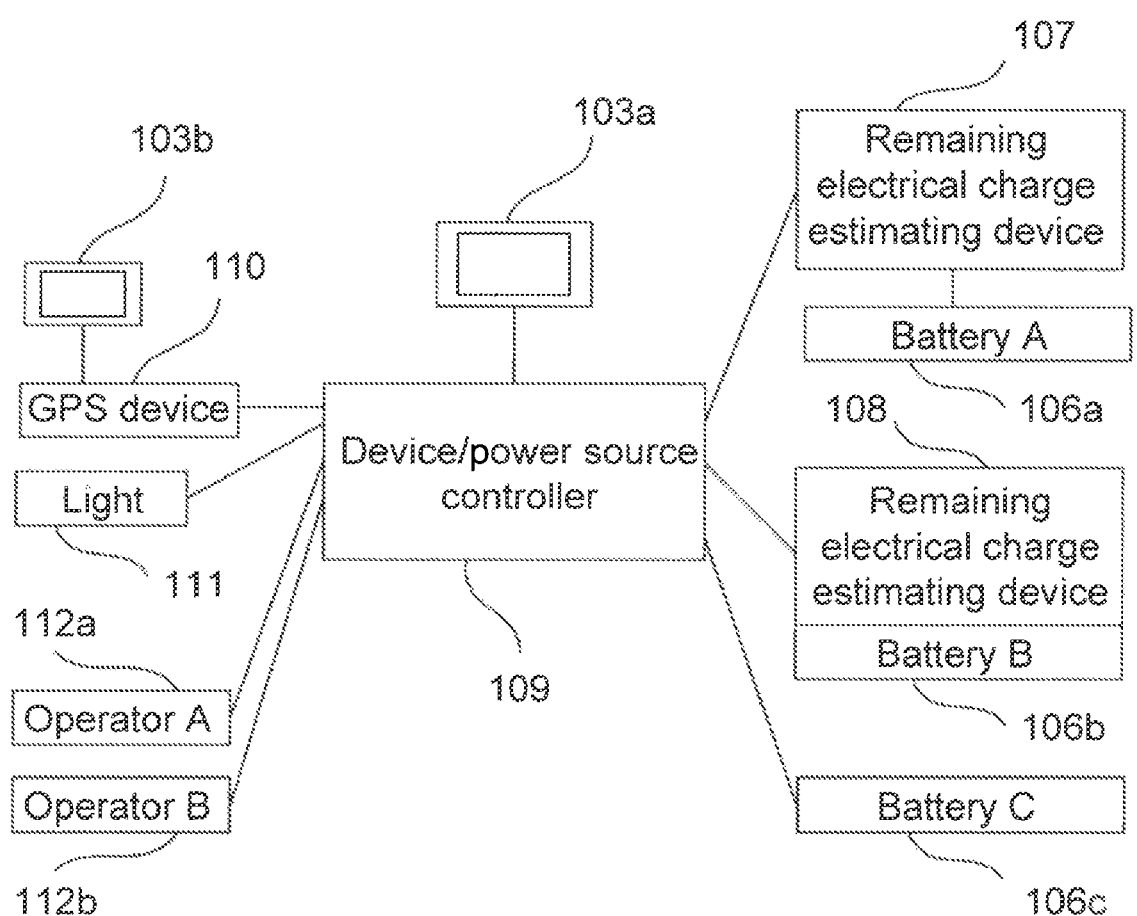
FIG. 14 illustrates an example of a single apparatus managing a plurality of batteries in a modification of the present embodiment.

Further, in another example, as shown in FIG. 14, among a plurality of secondary batteries 106, one secondary battery 106a is provided in the vicinity of a secondary battery remaining electrical charge estimating device 107. Another secondary battery 106b is provided near a secondary battery remaining electrical charge estimating device 108. In FIG. 14, another secondary battery 106c is not subjected to remaining electrical charge determination.

Furthermore, in FIG. 14, a device/power source controller 109 is connected to a GPS (Global Positioning System) device 110, a light 111, an operator 112 and the like. The device/power source controller 109 is used to supply and/or control power. For example, it controls turn-on and turn-off of the light 111, operation and energy consumption of the operator 112 and the like. As the GPS device 110 is capable of detecting a time as well as a position and an altitude, it can be utilized in time adjustment of the device/power source controller 109 and the like. With this configuration, the device/power source controller 109 is used to control the plural secondary batteries 106 and have each remaining electrical charge of the secondary batteries 106 displayed on the display unit 103a. Further, the device/power source controller 109, the secondary battery remaining electrical charge estimating device, a computer (not shown) and the like may be provided capable of communicating information with an external device via a connector or a wireless line (infrared radiation or the like) so that they can receive remaining electrical charge determination information, install and update control program.

Furthermore, determining of each remaining electrical charge of the plurality of secondary batteries allows estimation of load states, environmental each remaining electrical charge, life duration and the like of secondary batteries that are exchanged or charged almost at the same time. It is also possible to inform a user of a predicted time to be exchanged or charged.

Furthermore, a display unit 103 as shown in FIGS. 11 and 12, a storing unit (not shown) for storing a history of the secondary battery and a controlling/determining device having a program for holding the history of the secondary battery that is charged to be used or continuously usable and/or determining the secondary battery (see the power controller 5, the secondary battery remaining electrical charge estimating device 6 and the like in FIG. 1) are provided to be able to determine a remaining electrical charge of the secondary battery.

With this configuration, at least one battery is always usable as a secondary battery. Therefore, the present invention is effectively used in such a system or an apparatus as is always powered on.

A battery detecting sensor 101A as described above and a battery power source system including the battery detecting sensor have a voltage estimating unit for obtaining a stable open circuit voltage estimated value after a lapse of desired time. This voltage estimating unit uses an approximation function including a plurality of exponential function terms of time and a plurality of coefficients, first obtains at least one inferior logarithm coefficient of the exponential function terms as a function of temperature, stops charge and discharge operation for a predetermined time period, measures the battery voltage over time and temperature in the meantime, determines each of the exponential function coefficients that is expressed as function of temperature based on the measured temperature and determines the other coefficients based on the battery voltage-time relation.

A battery detecting sensor 101A and a battery power source system including the battery detecting sensor have a voltage estimating unit for obtaining a stable open circuit voltage estimated value after a lapse of desired time. This voltage estimating unit uses an approximation function including a plurality of exponential function terms of time and a plurality of coefficients, obtains a function of which at least one inferior logarithm coefficient of the exponential function terms is expressed by another representative inferior logarithm coefficient, stops charge and discharge operation for a predetermined time period, measures the battery voltage over time and temperature in the meantime and determines the coefficients of the exponential function terms based on the battery voltage-time relation.

The present specification is based on the Japanese Patent Application No. 2005-164112 filed on Jun. 3, 2005, the entire contents of which are incorporated by reference herein.

The invention claimed is:

1. A method for estimating a remaining electrical charge or a remaining capacity of a battery that supplies power to a load, the method comprising:

using, at a controller of a battery system, an approximate exponential decay function including a plurality of exponential function terms of time and a plurality of coefficients;

stopping, at the battery system, a charge or discharge operation of the battery for a predetermined time;

measuring, at a sensor of the battery system, a voltage of the battery at a plurality of instances during the predetermined time;

obtaining, at the controller of the battery system, a relationship between the voltage of the battery and time;

determining, at the controller of the battery system, the coefficients based on the obtained relationship between the voltage of the battery and the time, wherein the determining includes determining at least one power coefficient of an inferior logarithm of the exponential function terms by expressing the at least one power coefficient of the inferior logarithm of the exponential function terms as a predetermined function of temperature; and obtaining, at the controller of the battery system, an estimate of a stable open circuit voltage of the battery based on determined values for the coefficients.

2. The method of claim 1, further comprising:

allowing an amount of time between the stopping and a starting of the measuring and reducing the exponential function terms in number.

3. The method of claim 1, wherein the approximate exponential decay function is expressed as F(T)=A1 exp(A5 T)+A2 exp(A6 T)+A3 exp(A7 T)+A4 exp(A8 T)+A9, wherein A1, A2, A3, A4, A5, A6, A7, A8, and A9 are the coefficients, T is time, and the determining includes expressing at least one of coefficients A5, A6, A7, and A8 as the predetermined function of temperature.

4. An apparatus that estimates a remaining electrical charge or a remaining capacity of a battery that supplies power to a load, the apparatus comprising:
- a controller that uses an approximate exponential decay function including a plurality of exponential function terms of time and a plurality of coefficients;
- a charge circuit that stops a charge or discharge operation of the battery for a predetermined time; and
- a sensor that measures a voltage of the battery at a plurality of instances during the predetermined time, wherein
- the controller obtains a relationship between the voltage of the battery and time, determines the coefficients based on the obtained relationship between the voltage of the battery and the time, determines at least one power coefficient of an inferior logarithm of the exponential function terms by expressing the at least one power coefficient of the inferior logarithm of the exponential function terms as a predetermined function of temperature, and obtains an estimate of a stable open circuit voltage of the battery based on determined values of the coefficients.

5. The apparatus of claim 4, wherein the controller allows an amount of time between stopping of the charge or discharge operation and starting of measuring of the battery voltage and reduces the exponential function terms in number.

6. The apparatus of claim 4, wherein the approximate exponential decay function is expressed as F(T)=A1 exp(A5 T)+A2 exp(A6 T)+A3 exp(A7 T)+A4 exp(A8 T)+A9, wherein A1, A2, A3, A4, A5, A6, A7, A8, and A9 are the coefficients, T is time, and the controller expresses at least one of coefficients A5, A6, A7, and A8 as the predetermined function of temperature.

7. A system comprising:
- a battery that supplies power to a load;
- a controller that uses an approximate exponential decay function including a plurality of exponential function terms of time and a plurality of coefficients;
- a charge circuit that stops a charge or discharge operation of the battery for a predetermined time; and
- a sensor that measures a voltage of the battery at a plurality of instances during the predetermined time, wherein
- the controller obtains a relationship between the voltage of the battery and time, determines the coefficients based on the obtained relationship between the voltage of the battery and the time, determines at least one power coefficient of an inferior logarithm of the exponential function terms by expressing the at least one power coefficient of the inferior logarithm of the exponential function terms as a predetermined function of temperature, and obtains an estimate of a stable open circuit voltage of the battery based on determined values of the coefficients.

8. The system of claim 7, wherein the controller allows an amount of time between stopping of the charge or discharge operation and starting of measuring of the battery voltage and reduces the exponential function terms in number.

9. The system of claim 7, wherein the approximate exponential decay function is expressed as F(T)=A1 exp(A5 T)+A2 exp(A6 T)+A3 exp(A7 T)+A4 exp(A8 T)+A9, wherein A1, A2, A3, A4, A5, A6, A7, A8, and A9 are the coefficients, T is time, and the controller expresses at least one of coefficients A5, A6, A7, and A8 as the predetermined function of temperature.

10. A method for estimating a remaining electrical charge or a remaining capacity of a battery that supplies power to a load, the method comprising:
- using, at a controller of a battery system, an approximate exponential decay function including a plurality of exponential function terms of time and a plurality of coefficients;
- stopping, at the battery system, a charge or discharge operation of the battery for a predetermined time;
- measuring, at a sensor of the battery system, a voltage of the battery at a plurality of instances during the predetermined time;
- obtaining, at the controller of the battery system, a relationship between the voltage of the battery and time;
- determining, at the controller of the battery system, the coefficients based on the obtained relationship between the voltage of the battery and the time, wherein each of power coefficients of a natural logarithm of each of the exponential function terms is expressed as a temperature function including at least one coefficient, the coefficient of the temperature function of a first one of the power coefficients is determined in advance as a function of the coefficient of the temperature function of another of the power coefficients, and the determining includes determining the coefficient of the temperature function of the another of the power coefficients; and
- obtaining, at the controller of the battery system, an estimate of a stable open circuit voltage of the battery based on determined values of the coefficients.

11. The method of claim 10, further comprising:
- allowing an amount of time between the stopping and a starting of the measuring and reducing the exponential function terms in number.

12. An apparatus for estimating a remaining electrical charge or a remaining capacity of a battery that supplies power to a load, the apparatus comprising:
- a controller that uses an approximate exponential decay function including a plurality of exponential function terms of time and a plurality of coefficients;
- a charging circuit that stops a charge or discharge operation of the battery for a predetermined time; and
- a sensor that measures a voltage of the battery at a plurality of instances during the predetermined time, wherein
- the controller obtains a relationship between the voltage of the battery and time and determines the coefficients based on the obtained relationship between the voltage of the battery and the time,
- each of power coefficients of a natural logarithm of each of the exponential function terms is expressed as a temperature function including at least one coefficient, the coefficient of the temperature function of a first one of the power coefficients is determined in advance as a function of the coefficient of the temperature function of another of the power coefficients, and
- the controller further determines the coefficient of the temperature function of the another of the power coefficients, and obtains an estimate of a stable open circuit voltage of the battery based on determined values of the coefficients.

13. The apparatus of claim 12, wherein the controller allows an amount of time between stopping of the charge or discharge operation and starting of measuring of the battery voltage and reduces the exponential function terms in number.

14. A system comprising:
- a battery that supplies power to a load;
- a controller that uses an approximate exponential decay function including a plurality of exponential function terms of time and a plurality of coefficients;
- a charging circuit that stops a charge or discharge operation of the battery for a predetermined time; and
- a sensor that measures a voltage of the battery at a plurality of instances during the predetermined time, wherein
- the controller obtains a relationship between the voltage of the battery and time and determines the coefficients based on the obtained relationship between the voltage of the battery and the time,
- each of power coefficients of a natural logarithm of each of the exponential function terms is expressed as a temperature function including at least one coefficient, the coefficient of the temperature function of a first one of the power coefficients is determined in advance as a function of the coefficient of the temperature function of another of the power coefficients, and
- the controller further determines the coefficient of the temperature function of the another of the power coefficients, and obtains an estimate of a stable open circuit voltage of the battery based on determined values of the coefficients.

15. The system of claim 14, wherein the controller allows an amount of time between stopping of the charge or discharge operation and starting of measuring of the battery voltage and reduces the exponential function terms in number.

* * * * *